US008035461B1

(12) United States Patent  (10) Patent No.: US 8,035,461 B1
Barrett  (45) Date of Patent: Oct. 11, 2011

(54) INDUCTIVE FILTER AND METHOD OF REDUCING VIBRATION SENSITIVITY

(75) Inventor: Bradley A Barrett, Germantown, MD (US)

(73) Assignee: Nortel Networks Limited, Ontario (CA)

( * ) Notice: Subject to any disclaimer, the term of this patent is extended or adjusted under 35 U.S.C. 154(b) by 136 days.

(21) Appl. No.: 12/342,532

(22) Filed: Dec. 23, 2008

Related U.S. Application Data

(60) Provisional application No. 61/008,883, filed on Dec. 26, 2007.

(51) Int. Cl.
*H03H 7/00* (2006.01)
*H03H 7/06* (2006.01)
(52) U.S. Cl. .................. 333/177; 333/167; 333/181
(58) Field of Classification Search .............. 333/167, 333/177, 181, 185
See application file for complete search history.

(56) References Cited

U.S. PATENT DOCUMENTS 3,996,537 A * 12/1976 Neuman .................. 333/177

\* cited by examiner

*Primary Examiner* — Robert Pascal
*Assistant Examiner* — Kimberly Glenn
(74) *Attorney, Agent, or Firm* — Edell, Shapiro & Finnan, LLC

(57) ABSTRACT

A filter according to a present invention embodiment reduces the effects of microphonic behavior in a communications network. The filter passes a network signal, while filtering out unwanted voiceband leakage (e.g., emissions of plaintext voice signals) due to microphonic behavior of the network equipment. The filter employs inductive units each including at least two inductive elements connected in series and arranged to cancel current within the inductive elements induced by vibrations and/or sound pressure (or acoustic) waves in the surrounding environment, thereby reducing extraneous signals produced within the filter (e.g., signals produced from microphonic behavior that may be in the form of perceivable voice or audio, noise, etc.). The filter reduces the extraneous signals in active and passive modes, and prevents compromise of secure or sensitive information (e.g., in the form of perceivable voice or audio) due to microphonic behavior of filter elements.

22 Claims, 8 Drawing Sheets

OPTIONAL STAGE(S) AS REQUIRED
FOR APPLICATION

INDUCTIVE FILTER AND METHOD OF REDUCING VIBRATION SENSITIVITY

CROSS-REFERENCE TO RELATED APPLICATIONS

This application claims priority from U.S. Provisional Patent Application Ser. No. 61/008,883, entitled "Method of Reducing Vibration Noise Sensitivity in Inductive Circuits and for Isolating Encrypted Packetized Voice from Plaintext Voiceband Leakage on a Network Link Using Inductive Circuits" and filed Dec. 26, 2007, the disclosure of which is incorporated herein by reference in its entirety.

BACKGROUND

1. Technical Field

The present invention embodiments pertain to reduction of extraneous signals within electrical elements. In particular, the present invention embodiments pertain to electrical filters with one or more inductive units each including at least two inductive elements connected in series and arranged to cancel current within the inductive elements induced by vibrations and/or sound pressure (or acoustic) waves, thereby reducing extraneous signals (e.g., signals produced from microphonic behavior, noise, etc.).

2. Discussion of Related Art

In secured facilities, modern networked digital telephone systems (e.g., Voice over Internet Protocol (VoIP) systems) eliminate many of the security concerns with older telephony systems. This is primarily due to the potential to encrypt the voice transmission "end-to-end" beginning at the handset of the telephone device. Although the intentional, packetized voice signal is protected by encryption, limitations of the VoIP equipment design may result in measurable unintended emissions of the original unencrypted (or plaintext) analog voice signal onto a computer network cable. Since almost any inductive component in a telecommunications or computer networking device may exhibit microphonic behavior (e.g., emissions of the conveyed signal) in response to acoustic vibrations, unintended voiceband emissions of plaintext may be present on a network interface when a call is not in progress, or even during the interval equipment is powered down.

Accordingly, telephony equipment intended for installation in secured facilities is tested for immunity to this potential security breach by exposing the equipment to test tones (at voice frequencies from a loudspeaker and at calibrated sound pressure levels), and measuring the electrical signal level present at the corresponding frequency on a network interface cable. In the event of a testing failure, the equipment may be redesigned to pass the test, thereby significantly increasing the costs and complexity of the equipment.

In the event electronic circuitry is utilized to correct the deficiencies, certain circuit elements may be susceptible to microphonic behavior (e.g., emissions of the plaintext or conveyed signal that may be in the form of perceivable voice or audio), thereby producing extraneous signals (e.g., signals produced from microphonic behavior, noise, etc.). A source of these extraneous signals (e.g., voice or audio signals produced from microphonic behavior, noise, etc.) in electronic circuits includes vibration present in the operating environment. For example, mechanical vibration and sound pressure (or acoustic) waves may initiate microphonic behavior and produce the extraneous signals in a circuit exposed to those items. Ferrous core inductors or coils are among circuit elements that are most sensitive to vibration and sound pressure waves. These stimuli may excite vibration of inductor windings with respect to the fixed core, and induce an unwanted alternating current (representing the extraneous signals (e.g., audio or electrical noise)) in the coil with the same frequency as the inducing vibration force. Although the inductor windings may be encapsulated in a rigid compound (e.g., epoxy resin) to prevent movement of the windings relative to the core, this construction is often not available "off the shelf", or is more costly to produce.

SUMMARY

According to the present invention embodiments, a filter reduces the effects of microphonic behavior in a communications network. The filter passes a network signal, preferably including digitized voice signals, while filtering out unwanted voiceband leakage (e.g., emissions of plaintext voice signals) due to microphonic behavior of the network equipment. The filter employs inductive units each including at least two inductive elements connected in series and arranged to cancel current within the inductive elements induced by vibrations and/or sound pressure (or acoustic) waves in the surrounding environment, thereby reducing extraneous signals produced within the filter (e.g., signals produced from microphonic behavior that may be in the form of perceivable voice or audio, noise, etc.). The filter reduces the extraneous signals in an active mode when processing signals between the network and network equipment, thereby providing a passed network signal substantially unaltered. In addition, the filter reduces the extraneous signals in a passive mode (e.g., in the absence of signals between the network and network equipment). Accordingly, the filter prevents compromise of secure or sensitive information (e.g., in the form of perceivable voice or audio) due to microphonic behavior of filter elements, and maintains security. The filter is preferably disposed external of network equipment and within a network link. However, the filter may alternatively be disposed within network equipment (e.g., retrofitted within the equipment, included within the equipment design, etc.).

The present invention embodiments provide several advantages. For example, an embodiment of the present invention may be inserted in a network link or within network equipment to be easily retrofitted for an existing equipment design. In this manner, a non-compliant equipment design may be corrected without redesigning the equipment. The present invention embodiment is simpler and lower in cost relative to other retrofit solutions (e.g., an optoisolator or a redesign of the equipment), and consumes no power. Further, the present invention embodiment provides effective isolation of voiceband leakage, including both common-mode and differential leakage. Moreover, the present invention embodiment supports communications channels that employ simultaneous signaling in both directions on wire pairs (e.g., 1000Base-T Ethernet, etc.). In addition, the present invention embodiment reduces extraneous signals (e.g., signals produced from microphonic behavior that may be in the form of perceivable voice or audio, noise, etc.) in both active and passive modes, thereby preventing compromise of secure or sensitive information due to microphonic behavior and maintaining security.

The above and still further features and advantages of the present invention embodiments will become apparent upon consideration of the following detailed description of example embodiments thereof, particularly when taken in

DETAILED DESCRIPTION OF EXAMPLE EMBODIMENTS

Digital telephone systems (e.g., Voice over Internet Protocol (VoIP) systems) eliminate many security concerns due to the ability to encrypt a voice transmission. Although the packetized voice signal is protected by encryption, limitations of the equipment design may result in measurable unintended emissions of the original unencrypted (or plaintext) analog voice signal onto a computer network cable. Since almost any inductive component in a telecommunications or computer networking device may exhibit microphonic behavior (e.g., emissions of the conveyed signal) in response to acoustic vibrations, unintended voiceband emissions of plaintext may be present on a network interface when a call is not in progress, or even during the interval equipment is powered down. For example, plaintext or unencrypted voice or speech signals conveyed by a user into a communications device (e.g., handset, etc.) of the digital telephone system may be reproduced by inductive components due to microphonic behavior of those components, even though the voice signals are eventually encrypted for transmission.

Figure 1:
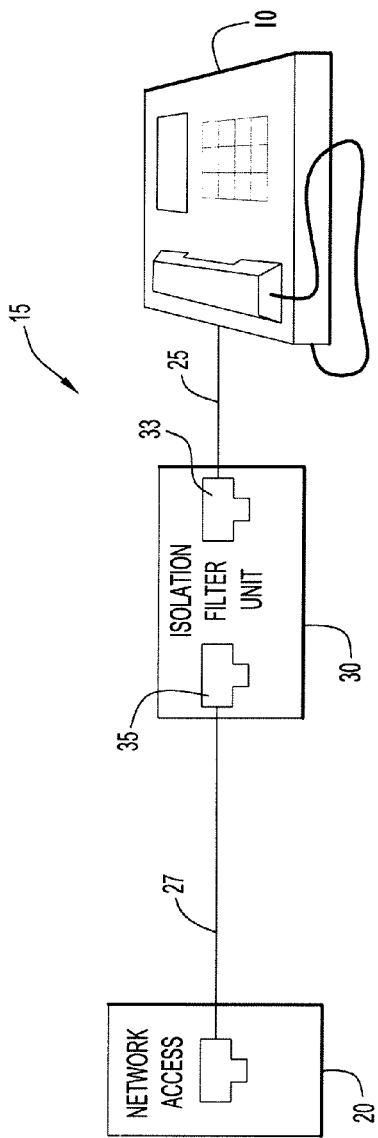
FIG. 1 is a diagrammatic illustration of an isolation filter unit disposed in a network link and including an isolation filter according to an embodiment of the present invention.

The present invention embodiments reduce the effects of microphonic behavior in a communications network as illustrated in FIG. 1. Specifically, a communications device 10 is coupled to a network access connector 20 via a network link 15. The communications device is preferably a telephone handset configured to communicate voice or audio signals over a digital telephone system or network. Network access connector 20 may be implemented by any conventional data access port connector, and provides access to the digital telephone system. An isolation filter unit 30 according to an embodiment of the present invention is disposed between communications device 10 and network access connector 20 to process signals therebetween, and includes a device connector 33 and a network connector 35. The device and network connectors may be implemented by any conventional data or other port connectors. Device connector 33 couples the isolation filter unit to communications device 10 via a cable 25, while network connector 35 couples the isolation filter unit to network access device 20 via a cable 27. Cables 25, 27 may be implemented by any conventional or other network cable. Alternatively, isolation filter unit 30 may be disposed within communications device 10.

Figure 2:
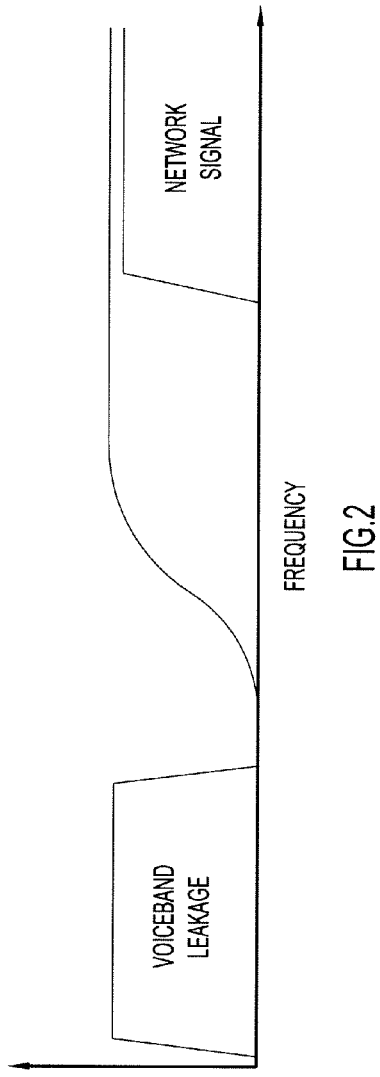
FIG. 2 is a graphical illustration of the characteristics of the isolation filter of FIG. 1 relative to the frequencies of a network signal and voiceband leakage.

Referring to FIG. 2, the network signal (e.g., VoIP signal) has a greater frequency than the voiceband, thereby enabling the voiceband and network signals to be isolated. Isolation filter unit 30 includes an isolation filter (e.g., filter 60, 70, 80) as described below and coupled between connectors 33, 35, to remove or filter the voiceband leakage (e.g., emissions of plaintext voice signals) due to microphonic behavior of inductive elements of communications device 10. In other words, the isolation filter blocks signals (e.g., in the approximate range of 200 Hz-8 kHz) in the voiceband frequency range, while passing the network signal. The design of the isolation filter preferably includes one or more capacitive components (e.g., capacitors, etc.) and one or more inductive components (e.g., inductors, etc.), and may further include additional circuit components (e.g., resistive components, etc.). In order to reduce introduction of extraneous signals (e.g., signals produced from microphonic behavior that may be in the form of perceivable voice or audio, noise, etc.) due to vibrations and/or sound pressure (or acoustic) waves in the surrounding environment, the inductive components in the design of the isolation filter are implemented by inductive units each including at least two inductive elements (e.g., inductors, etc.) arranged to cancel current within the inductive elements induced by the vibrations and/or sound pressure (or acoustic) waves as described below. The isolation filter reduces the extraneous signals in an active mode when processing signals between the digital telephone system and communications device 10, thereby providing a passed network signal substantially unaltered. In addition, the isolation filter reduces the extraneous signals in a passive mode (e.g., in the absence of signals between the network and network equipment). Accordingly, the isolation filter prevents compromise of secure or sensitive information (e.g., in the form of perceivable voice or audio) due to microphonic behavior of isolation filter elements, and maintains security. For example, plaintext or unencrypted voice or speech signals conveyed by a user into communications device 10 may be reproduced by inductive components due to microphonic behavior of those components (e.g., the voice signals being incident on inductive components in the vicinity of the communications device), even though the voice signals may be encrypted. The reproduced signals are typically perceivable and may be susceptible to interception. The inductive units of the isolation filter are configured to reduce the effect of microphonic behavior in both passive and active modes, thereby preventing compromise of the voice signals.

Figure 3:
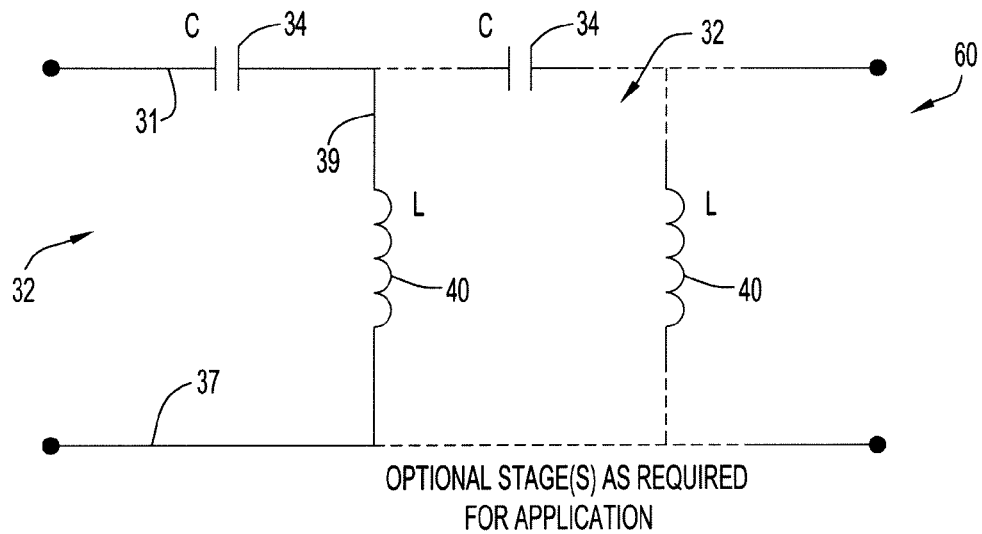
FIG. 3 is an electrical schematic diagram of an isolation filter according to an embodiment of the present invention.

An isolation filter according to an embodiment of the present invention is illustrated in FIG. 3. In particular, isolation filter 60 includes one or more stages 32, depending upon the desired filter complexity for an application. Each stage 32 includes conductors 31, 37, 39, a capacitor 34, and an inductive unit 40. Conductor 39 is disposed between and coupled to conductors 31 and 37. Capacitor 34 is disposed along conductor 31, while inductive unit 40 is disposed along conductor 39 and coupled to capacitor 34. The inductive unit is coupled to conductors 31, 37 at the junctions of conductors 31, 39 and conductors 37, 39 (each located beyond capacitor 34). Subsequent stages 32 are each appended to an immediately preceding stage and extend from the junctions of conductors 31, 39 and conductors 37, 39 of the prior stage.

A source of extraneous signals (e.g., voice or audio signals produced from microphonic behavior, noise, etc.) in electronic circuits includes vibration present in the operating environment. For example, mechanical vibration and sound pressure waves may produce the extraneous signals in a circuit exposed to those items. Ferrous core inductors or coils are among circuit elements that are most sensitive to vibration and sound pressure waves. These stimuli may excite vibration of inductor windings with respect to the fixed core, and induce an unwanted alternating current (representing the extraneous signals (e.g., audio or electrical noise)) in the coil with the same frequency as the inducing vibration force.

Figure 4:
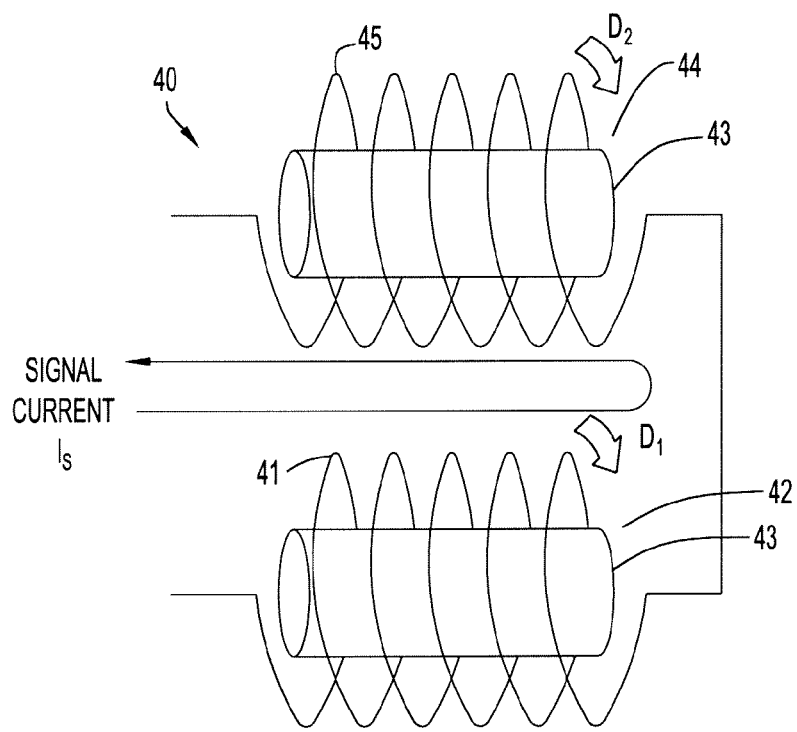
FIG. 4 is a diagrammatic illustration of signal current flowing through adjacent inductive elements of an inductive unit configured in accordance with an embodiment of the present invention.

In order to significantly reduce the extraneous signals (e.g., voice or audio signals produced from microphonic behavior, noise, etc.) induced in an inductive element, isolation filter 60 employs inductive unit 40 as illustrated in FIG. 4. In particular, the inductive unit represents a corresponding inductive component in the design of isolation filter 60, and includes inductive elements 42, 44. Inductive element 42 includes a substantially cylindrical core 43 with a coil or windings 41 disposed about core 43 (e.g., in a direction $D_1$ as viewed in FIG. 4). Inductive element 44 similarly includes substantially cylindrical core 43 and a coil or windings 45. By way of example only, windings 45 are disposed about core 43 in the same direction (e.g., direction $D_2$ as viewed in FIG. 4) that windings 41 are disposed about core 43 of inductive element 42. Inductive elements 42, 44 are directly connected in series with their axes substantially parallel and arranged with a signal path (e.g., a 'U'-shaped path, etc.) directing currents induced by vibration and/or sound pressure (or acoustic) waves to flow toward each other (e.g., between the inductive elements) and effectively cancel, thereby removing the extraneous signals as described below. The series arrangement of inductive elements 42, 44 enable the combined inductance to match the desired inductance of inductive unit 40. In other words, each inductive element 42, 44 includes an inductance equal to one-half the desired inductance for inductive unit 40 (e.g., each inductive element includes an inductance of n/2 Henrys, where n Henrys is the desired inductance for inductive unit 40).

Isolation filter 60 is generally implemented in the form of a multi-pole passive high-pass filter inserted into each signal-bearing wire pair. The filter design is preferably tuned to the characteristic impedance of the network cable employed (e.g., cables 25, 27 of FIG. 1). The corner frequency of isolation filter 60 is designed to be below that of the network signal (and above the voiceband signal) to enable the isolation filter to block the voiceband signals (including the voiceband leakage due to microphonic behavior of the communications device) and pass the network signal unaltered. The complexity (e.g., number of poles) of isolation filter 60 and the characteristics of the filter components (e.g., inductance, capacitance, etc.) may be of any desired values suitable to provide the desired attenuation in the voiceband.

Figure 5:
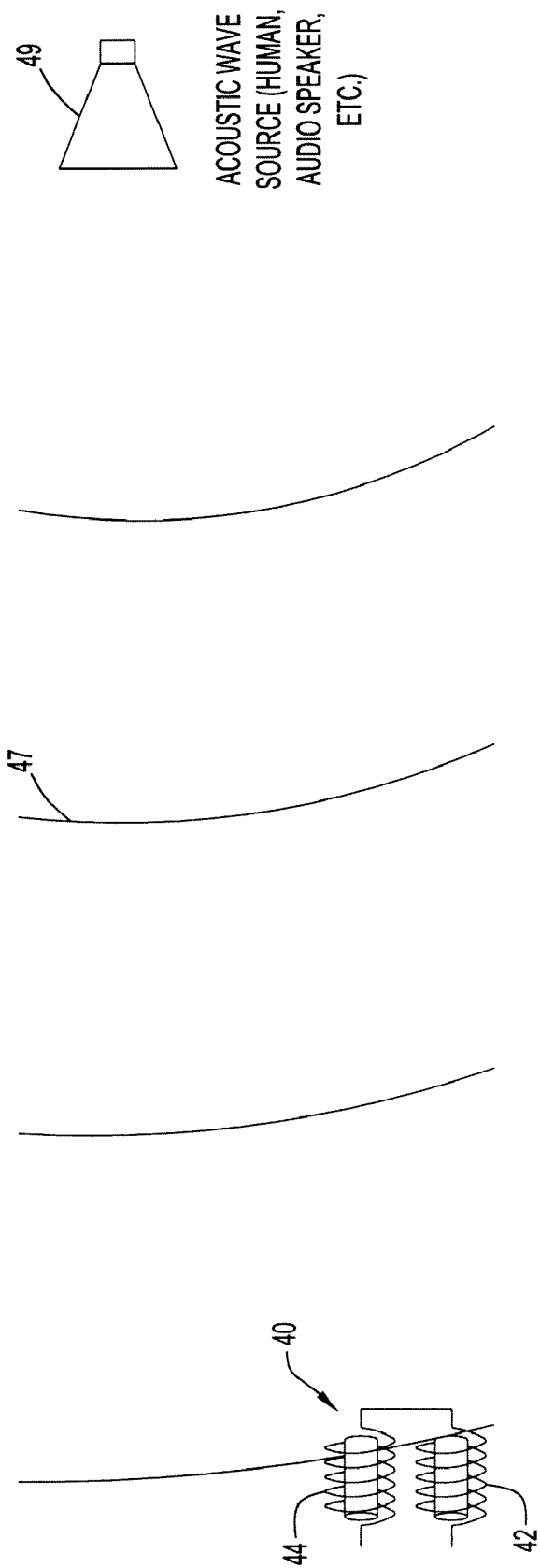
FIG. 5 is a diagrammatic illustration of the effect of acoustic waves on the inductive unit of FIG. 4.

Referring to FIG. 5, inductive unit 40 is exposed to acoustic or sound waves 47 from an acoustic wave or vibration source 49 (e.g., human voice, audio speaker, etc.). The wavelength, λ, of an acoustic or sound wave is expressed by the following equation:

$$\lambda = c/f,$$

where f is the frequency of the acoustic wave, and c is the speed of sound in the medium through which the wave travels. For example, the speed of sound in air at 25° C. is approximately 346.65 meters/second. Accordingly, the approximate wavelength of acoustic or sound waves in air at various audible frequencies based on the above equation is shown in Table I.

TABLE I

WAVELENGTH OF SOUND WAVES AT VARIOUS FREQUENCIES IN AIR (25° C.)

| Frequency | Wavelength |
| --- | --- |
| 100 Hz | 3.4665 m |
| 500 Hz | 69.33 cm |
| 1,000 Hz | 34.67 cm |
| 5,000 Hz | 6.93 cm |
| 10,000 Hz | 3.467 cm |

The wavelength of sound or acoustic waves in air within the audible frequency band (of Table I) is significantly greater than the dimensions and spacing of typical surface mount inductor components (e.g., on the order of 1 centimeter or less).

Further, the speed of sound in the FR4 fiberglass material used in the construction of printed circuit boards (PCBs) is approximately 3620 meters/second. Thus, the approximate wavelengths of the vibration waves induced in a PCB on which inductive elements 42, 44 are mounted based on the above equation is shown in Table II.

TABLE II

WAVELENGTH OF SOUND WAVES AT VARIOUS FREQUENCIES IN FR4 FIBERGLASS (25° C.)

| Frequency | Wavelength |
| --- | --- |
| 100 Hz | 36.2 m |
| 500 Hz | 7.24 m |
| 1,000 Hz | 3.62 m |
| 5,000 Hz | 72.4 cm |
| 10,000 Hz | 36.2 cm |

Accordingly, the wavelength of the induced vibrations in the PCB substrate on which inductive elements 42, 44 are mounted are at least an order of magnitude greater than the separation distance between those inductive elements. If the mounting separation between inductive elements 42, 44 is sufficiently small in relation to the distance to the vibration or acoustic wave source 49, these inductive elements are exposed to substantially similar vibration forces (e.g., in amplitude, frequency and phase).

Figure 6A:
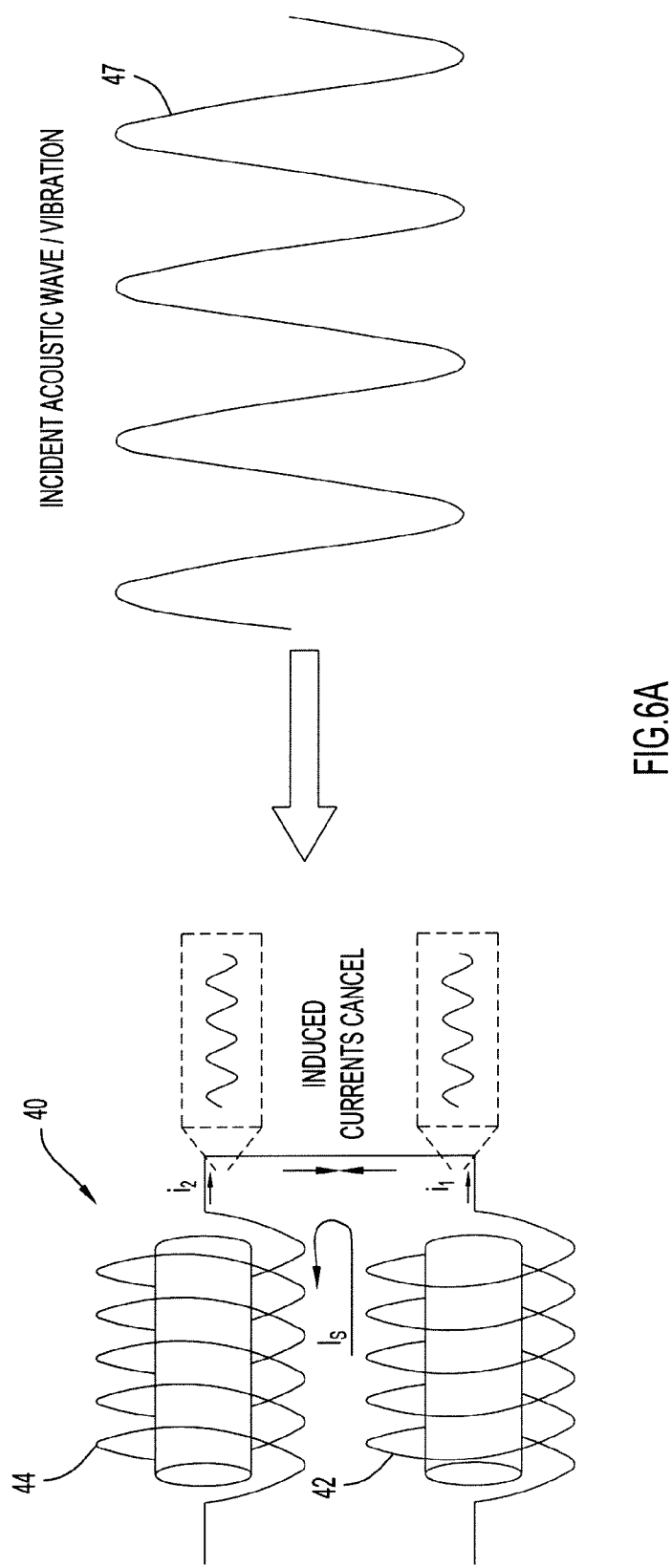
FIG. 6A is a diagrammatic illustration of the currents induced within the inductive unit of FIG. 4.

The effect of the arrangement of inductive elements 42, 44 to reduce extraneous signals is illustrated in FIG. 6A. Specifically, an intentional signal current, $I_s$, flows through inductive unit 40. This current is derived from the signals provided to isolation filter unit 30 from communications device 10 and network access connector 20 (FIG. 1). The intentional current signal flows through inductive element 42 followed by inductive element 44, and experiences a net inductance of the combined inductances of the inductive elements. Extraneous signal current $i_1$ is induced in inductive element 42 by incident vibration or acoustic waves 47 (e.g., audio or voice signals conveyed by a user to communications device 10, etc.), while extraneous signal current $i_2$ is induced in inductive element 44 by those incident waves. Extraneous signal currents $i_1$, $i_2$ induced in inductive elements 42, 44 are substantially similar in frequency, amplitude and phase, but opposing in direction due to the arrangement of coils 41, 45 and routing of the signal flow. This enables the extraneous signal currents to effectively cancel, thereby removing the vibration-induced extraneous signals in inductive unit 40, and enhancing the signal passed by the isolation filter. In addition, each inductive unit 40 of isolation filter 60 reduces the effect of microphonic behavior in both passive and active modes, thereby preventing compromise of any sensitive information in incident waves 47.

Figure 6B:
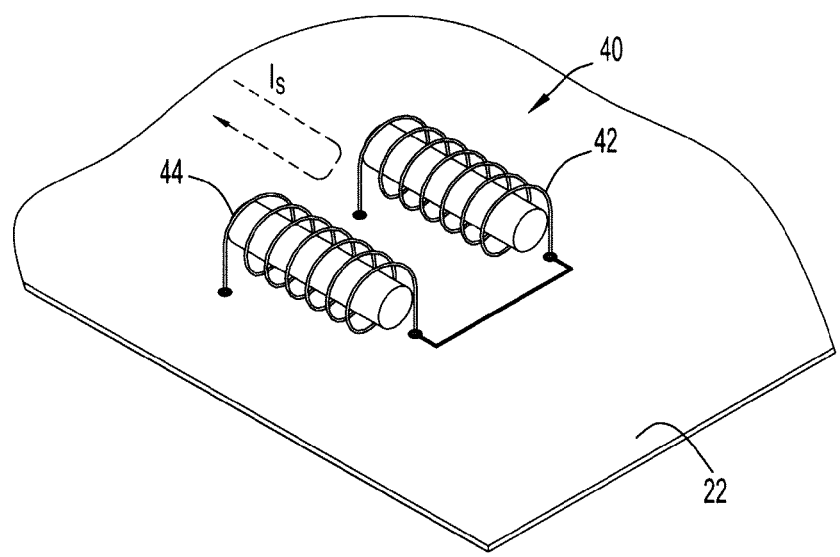
FIG. 6B is a diagrammatic illustration of an arrangement of the inductive elements of the inductive unit of FIG. 4 on a substrate.
Figure 6C:
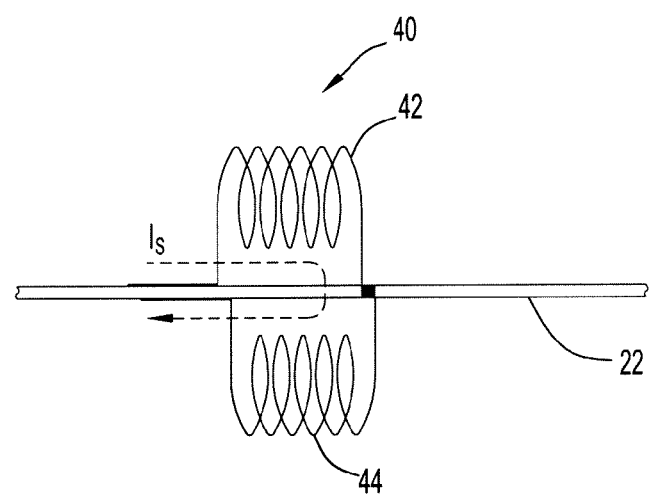
FIG. 6C is a diagrammatic illustration of an alternative arrangement of the inductive elements of the inductive unit of FIG. 4 on a substrate.

Referring to FIG. 6B, inductive elements 42, 44 are mounted on a substrate 22 (e.g., Printed Circuit Board (PCB), etc.) with their axes in substantially parallel relation, and are connected on an upper substrate surface with a signal path directing currents induced in those inductive elements to effectively cancel, thereby reducing extraneous signals as described above. Alternatively, inductive elements 42, 44 may be disposed on opposing surfaces of substrate 22 as illustrated in FIG. 6C. In this case, inductive elements 42, 44 are respectively disposed on the upper and lower surfaces of substrate 22 with a signal path directing currents induced in those inductive elements to effectively cancel, thereby reducing extraneous signals as described above.

Figure 6D:
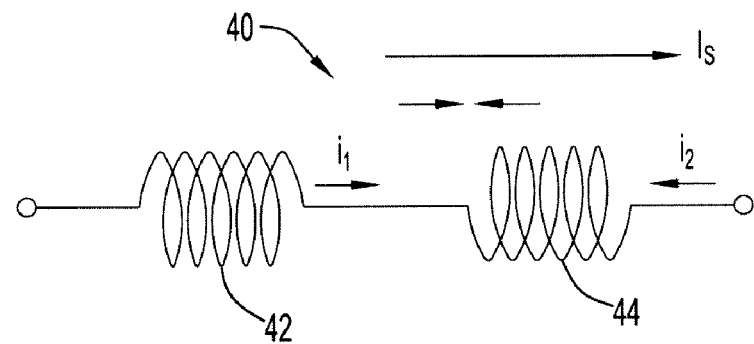
FIG. 6D is a diagrammatic illustration of an alternative arrangement for the inductive elements of the inductive unit of FIG. 4.

Inductive unit 40 may include any quantity of inductive elements, where the inductive elements may include the same or opposing winding directions and are arranged with a signal path that directs the induced currents to collectively cancel. An alternative arrangement of inductive elements 42, 44 within inductive unit 40 is illustrated, by way of example only, in FIG. 6D. Specifically, inductive elements 42, 44 are substantially similar to the inductive elements described above. In this case, inductive element 44 includes windings 45 disposed about core 43 (FIG. 4) in a direction opposite to the direction windings 41 are disposed about core 43 of inductive element 42. Accordingly, extraneous signal currents $i_1$, $i_2$ respectively induced in inductive elements 42, 44 due to incident vibration and/or sound pressure (or acoustic waves) flow in opposite directions. The inductive elements are connected in series and arranged with a signal path (e.g., a substantially linear path, etc.) directing the induced currents to flow toward each other (e.g., between the inductive elements) and effectively cancel, thereby removing the extraneous signals.

Figure 6E:
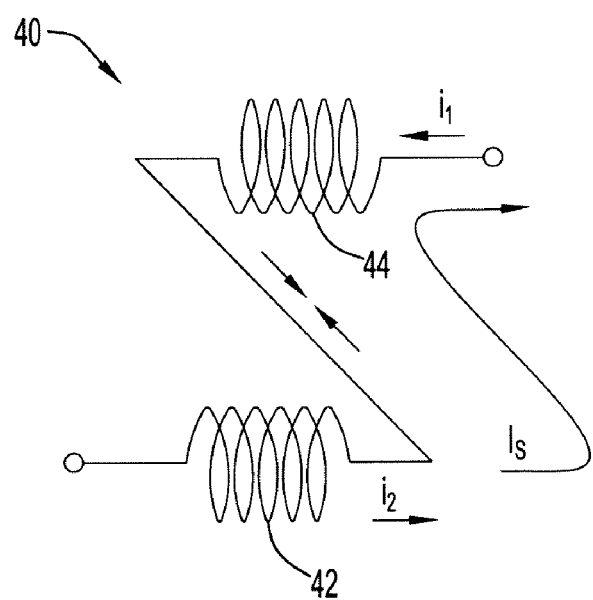
FIG. 6E is a diagrammatic illustration of yet another arrangement for the inductive elements of the inductive unit of FIG. 4.

Yet another arrangement of inductive elements 42, 44 within inductive unit 40 is illustrated, by way of example only, in FIG. 6E. Specifically, inductive elements 42, 44 are substantially similar to the inductive elements described above. In this case, inductive element 44 includes windings 45 disposed about core 43 (FIG. 4) in a direction opposite to the direction windings 41 are disposed about core 43 of inductive element 42. Accordingly, extraneous signal currents $i_1$, $i_2$ respectively induced in inductive elements 42, 44 due to incident vibration and/or sound pressure (or acoustic waves) flow in opposite directions. The inductive elements are connected in series and arranged with a signal path (e.g., a 'Z'—shaped path, etc.) directing the induced currents to flow toward each other (e.g., between the inductive elements) and effectively cancel, thereby removing the extraneous signals.

Figure 7:
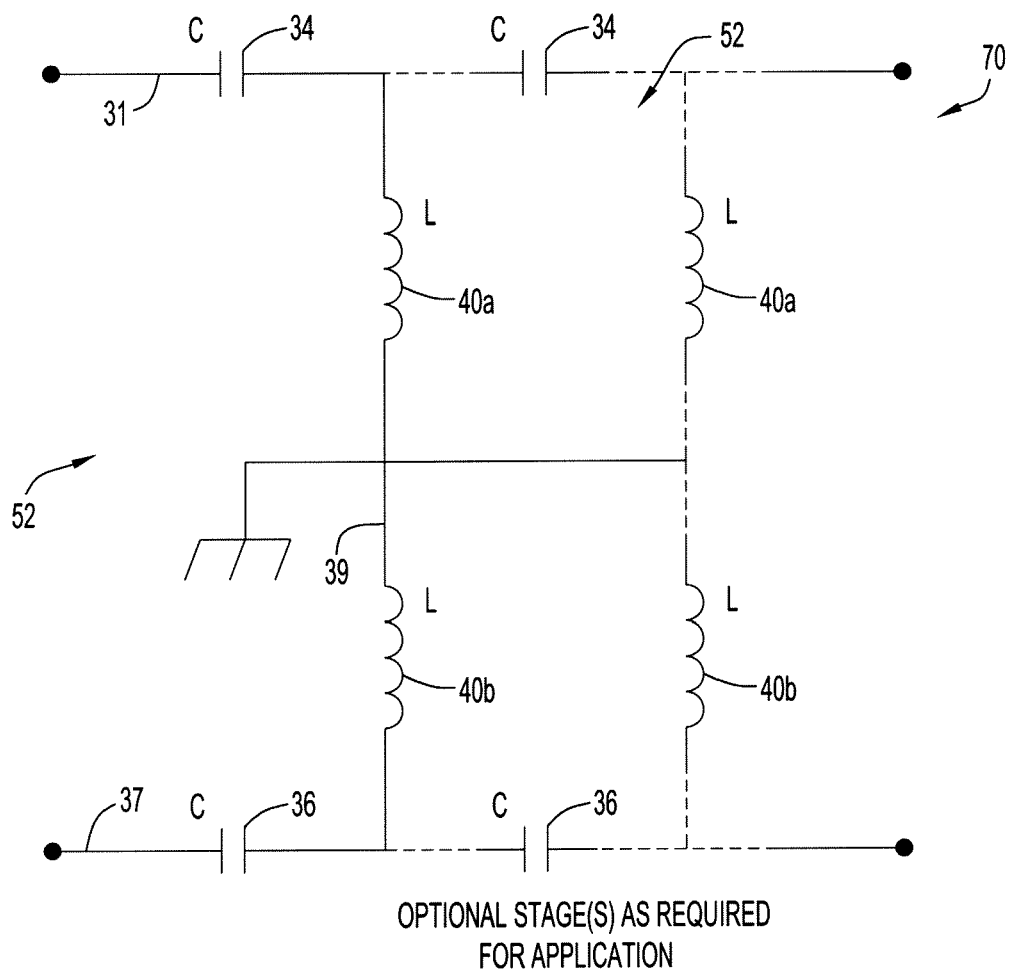
FIG. 7 is an electrical schematic diagram of an isolation filter according to another embodiment of the present invention.

An embodiment of the isolation filter for a balanced signal wire pair is illustrated in FIG. 7. Specifically, the design of isolation filter 70 is substantially symmetric, and includes one or more stages 52, depending upon the desired filter complexity for an application. Each stage 52 includes conductors 31, 37, 39, capacitors 34, 36 and inductive units 40a, 40b. Conductor 39 is disposed between and coupled to conductors 31 and 37. Capacitor 34 is disposed along conductor 31, while inductive unit 40a is disposed along conductor 39. Inductive unit 40a is coupled to capacitor 34, and disposed between a junction of conductors 31, 39 (located beyond capacitor 34) and a ground potential. Similarly, capacitor 36 is disposed along conductor 37, while inductive unit 40b is disposed along conductor 39. Inductive unit 40b is coupled to capacitor 36, and disposed between a junction of conductors 37, 39 (located beyond capacitor 36) and the ground potential. The ground potential is coupled to conductor 39 at a junction located between inductive units 40a, 40b. Subsequent stages 52 are each appended to an immediately preceding stage, and extend from: the junction of conductors 31, 39; the junction of conductors 37, 39; and the junction between inductive units 40a, 40b.

In order to increase the filter immunity to vibration (and/or sound pressure or acoustic wave) induced extraneous signals (e.g., signals produced from microphonic behavior that may be in the form of perceivable voice or audio, noise, etc.), inductive units 40a, 40b may include any of the current-canceling arrangements described above. In particular, each inductive element 40a, 40b is substantially similar to inductive unit 40 described above, and includes inductive elements 42, 44. Inductive element 42 includes substantially cylindrical core 43 with coil or windings 41 disposed about core 43. Inductive element 44 similarly includes substantially cylindrical core 43 and coil or windings 45; however, windings 45 may be disposed about core 43 in the same or opposite direction relative to the direction that windings 41 are disposed about core 43 of inductive element 42. Inductors 42, 44 are directly connected in series to enable the combined inductance to match the desired inductance of the respective inductive unit 40a, 40b (e.g., each inductive element includes an inductance of n/2 Henrys, where n Henrys is the desired inductance for inductive unit 40a, 40b).

Inductive elements 42, 44 of each respective inductive unit 40a, 40b are mounted on a substrate (e.g., Printed Circuit Board (PCB), etc.) with a signal path to effectively cancel the induced extraneous signal currents as described above. Basically, extraneous signal current is induced in each of inductive elements 42, 44 by incident vibration or acoustic waves. The extraneous signal current induced in inductive elements 42, 44 are substantially similar in frequency, amplitude and phase, but opposing in direction due to the arrangement of coils 41, 45 and routing of the signal flow. This enables the extraneous signal currents to effectively cancel, thereby removing the vibration-induced extraneous signals in inductive units 40a, 40b and enhancing the signal passed by the isolation filter. In addition, inductive units 40a, 40b of isolation filter 70 reduce the effect of microphonic behavior in both passive and active modes, thereby preventing compromise of any sensitive information in the incident vibration or acoustic waves.

Isolation filter 70 is generally implemented in the form of a multi-pole passive high-pass filter inserted into each signal-bearing wire pair. The filter design is preferably tuned to the characteristic impedance of the network cable employed (e.g., cables 25, 27 of FIG. 1). The corner frequency of isolation filter 70 is designed to be below that of the network signal (and above the voiceband signal) to enable the isolation filter to block the voiceband signals (including the voiceband leakage due to microphonic behavior of the communications device) and pass the network signal unaltered. The complexity (e.g., number of poles) of isolation filter 70 and the characteristics of the filter components (e.g., inductance, capacitance, etc.) may be of any desired values suitable to provide the desired attenuation in the voiceband.

Figure 8:
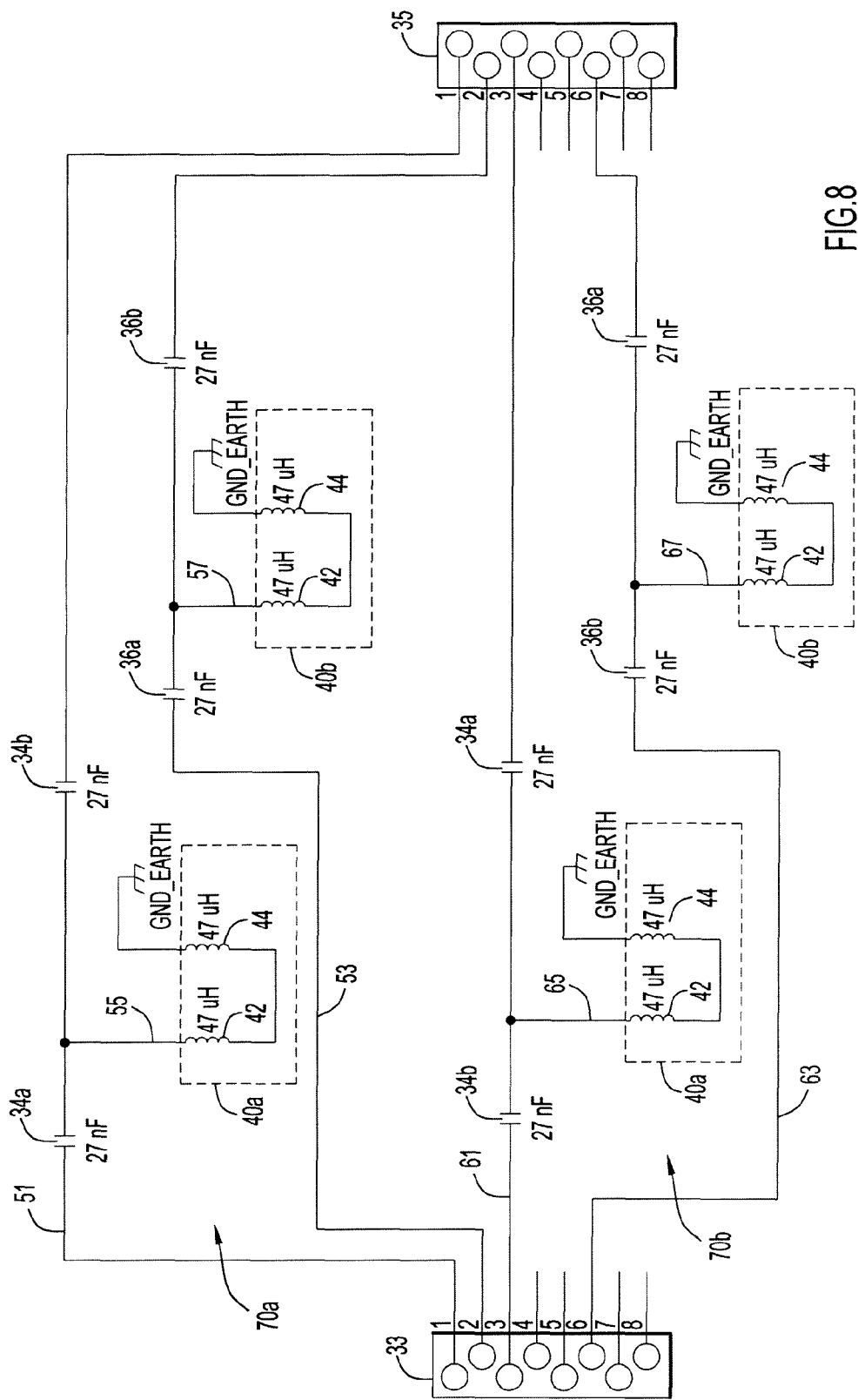
FIG. 8 is an electrical schematic diagram of an example isolation filter for a networking application according to an embodiment of the present invention.

An example embodiment of the isolation filter for a particular networking application is illustrated in FIG. 8. Initially, isolation filter 80 may be employed within isolation filter unit 30 and between communications device 10 and network access connector 20 (FIG. 1). Isolation filter 80 includes isolation filters 70a, 70b. Each isolation filter 70a, 70b is similar to isolation filter 70 for balanced signal wire pairs described above for FIG. 7, and corresponds to respective transmission (e.g., from communications device 10 to network access connector 20 (and the digital telephone system)) and reception (e.g., from network access connector 20 (and the digital telephone system) to communications device 10) operations. Specifically, isolation filter 80 is coupled between device connector 33 and network connector 35 of isolation filter unit 30. By way of example only, connectors 33, 35 include a series of pins 1-8, where isolation filter 70a for the transmission operation is coupled to pins 1 and 2 of the connectors, while isolation filter 70b is for the reception operation and is coupled to pins 3 and 6 of the connectors. However, the connectors may each include any quantity of pins, where the isolation filters 70a, 70b may be utilized for signals for any desired operations and be coupled to any quantity of any desired connector pins.

Isolation filter 70a includes conductors 51, 53, 55, 57, capacitors 34a, 34b, 36a, 36b and inductive units 40a, 40b. Isolation filter 70a processes signals for the communications device transmission operation (e.g., from communications device 10 to network access connector 20), thereby processing signals traveling from device connector 33 toward network connector 35. Conductor 51 is coupled to pin 1 of each connector 33, 35, while conductor 53 is coupled to pin 2 of each of those connectors. A capacitor 34a is disposed along conductor 51 toward device connector 33, while inductive unit 40a is disposed along conductor 55. Inductive unit 40a is disposed between a junction of conductors 51, 55 (located beyond capacitor 34a) and a ground potential. Capacitor 34b is disposed along conductor 51 subsequent inductive unit 40a toward network connector 35. Inductive unit 40a is thus coupled to capacitors 34a, 34b.

Similarly, a capacitor 36a is disposed along conductor 53 toward device connector 33, while inductive unit 40b is disposed along conductor 57. Inductive unit 40b is disposed between a junction of conductors 53, 57 (located beyond capacitor 36a) and a ground potential. Capacitor 36b is disposed along conductor 53 subsequent inductive unit 40b toward network connector 35. Inductive unit 40b is thus coupled to capacitors 36a, 36b.

Isolation filter 70b is substantially similar to isolation filter 70a and includes conductors 61, 63, 65, 67, capacitors 34a, 34b, 36a, 36b and inductive units 40a, 40b. Isolation filter 70b processes signals for the communications device reception operation (e.g., signals from network access connector 20 to communications device 10), thereby processing signals traveling from network connector 35 toward device connector 33. Conductor 61 is coupled to pin 3 of each connector 33, 35, while conductor 63 is coupled to pin 6 of each of those connectors. A capacitor 34a is disposed along conductor 61 toward network connector 35, while inductive unit 40a is disposed along conductor 65. Inductive unit 40a is disposed between a junction of conductors 61, 65 (located beyond capacitor 34a) and a ground potential. Capacitor 34b is disposed along conductor 61 subsequent inductive unit 40a toward device connector 33. Inductive unit 40b is thus coupled to capacitors 34a, 34b.

Similarly, a capacitor 36a is disposed along conductor 63 toward network connector 35, while inductive unit 40b is disposed along conductor 67. Inductive unit 40b is disposed between a junction of conductors 63, 67 (located beyond capacitor 36a) and a ground potential. Capacitor 36b is disposed along conductor 63 subsequent inductive unit 40b toward device connector 33. Inductive unit 40b is thus coupled to capacitors 36a, 36b.

In order to increase the filter immunity to vibration (and/or sound pressure or acoustic wave) induced extraneous signals (e.g., signals produced from microphonic behavior that may be in the form of perceivable voice or audio, noise, etc.), inductive units 40a, 40b of isolation filters 70a, 70b each preferably include the current-canceling arrangement described above for FIG. 6A. However, the inductive units of isolation filters 70a, 70b may alternatively include any of the current-canceling arrangements described above. In particular, each inductive element 40a, 40b is substantially similar to inductive unit 40 described above, and includes inductive elements 42, 44. Inductive element 42 includes substantially cylindrical core 43 with coil or windings 41 disposed about core 43. Inductive element 44 similarly includes substantially cylindrical core 43 and coil or windings 45 disposed about core 43 in the same direction relative to the direction that windings 41 are disposed about core 43 of inductive element 42. Inductors 42, 44 are directly connected in series to enable the combined inductance to match the desired inductance of the respective inductive unit 40a, 40b (e.g., each inductive element includes an inductance of n/2 Henrys, where n Henrys is the desired inductance for inductive unit 40a, 40b).

Inductive elements 42, 44 of each respective inductive unit 40a, 40b are mounted on a substrate (e.g., Printed Circuit Board (PCB), etc.) with a signal path to effectively cancel the induced extraneous signal currents as described above. Basically, extraneous signal current is induced in each of inductive elements 42, 44 by incident vibration or acoustic waves. The extraneous signal current induced in inductive elements 42, 44 are substantially similar in frequency, amplitude and phase, but opposing in direction due to the arrangement of coils 41, 45 and routing of the signal flow. This enables the extraneous signal currents to effectively cancel, thereby removing the vibration-induced extraneous signals in inductive units 40a, 40b, and enhancing the signal passed by the isolation filter. In addition, inductive units 40a, 40b of isolation filter 80 reduce the effect of microphonic behavior in both passive and active modes, thereby preventing compromise of any sensitive information in the incident vibration or acoustic waves.

Isolation filter 80 is generally implemented in the form of a multi-pole passive high-pass filter inserted into each signal-bearing wire pair. The filter design is preferably tuned to the characteristic impedance of the network cable employed (e.g., cables 25, 27 of FIG. 1). The corner frequency of isolation filter 80 is designed to be below that of the network signal (and above the voiceband signal) to enable the isolation filter to block the voiceband signals (including the voiceband leakage due to microphonic behavior of the communications device) and pass the network signal unaltered.

The complexity (e.g., number of poles) of isolation filter 80 and the characteristics of the filter components (e.g., inductance, capacitance, etc.) may be of any desired values suitable to provide the desired attenuation in the voiceband. By way of example only, capacitors 34a, 34b, 36a, 36b each include a capacitance of approximately 27 nanoFarads, while inductive units 40a, 40b each include an inductance of approximately 94 microHenrys (where each inductive element 42, 44 includes an inductance of approximately 47 microHenrys).

Isolation filter 80 (e.g., and filters 70a, 70b) accommodates 100Base-T Ethernet, and provides a corner frequency of approximately 80 kHz to 100 kHz (e.g., well below the Ethernet signal), thereby allowing the network signal to be passed without alteration. A third order isolation filter (e.g., of the forms shown in FIGS. 7-8 (e.g., filters 70, 70a, 70b)) inserted into both the transmit and receive signal pairs provides approximately 40 dB of attenuation at 8 kHz (e.g., the upper range of the voiceband).

It will be appreciated that the embodiments described above and illustrated in the drawings represent only a few of the many ways of implementing an inductive filter and method of reducing vibration sensitivity.

The present invention embodiments may be utilized in any types of circuits or filters (e.g., high-pass, low-pass, band-pass, etc.) including inductive or other components with coils or other items susceptible to motion from external sources and inducing any extraneous signals (e.g., audio, noise, voice, data, etc.). The present invention embodiments may be employed for any types of network or other signals, and may be configured to provide filtering for any desired frequencies or frequency ranges. The present invention embodiments may reduce any unwanted, unintentional or extraneous signals (e.g., audio, noise, voice, data, etc.) induced from any external or surrounding conditions exciting motion in inductive or other circuit element coils or windings (e.g., vibrations, sounds, motion of the circuit, air flow or wind, etc.).

The isolation filter unit may include any quantity of isolation filters, where any quantity of isolation filter units may be employed within a network or other link in any desired fashion. The isolation filter may include any quantity of poles (e.g., any desired complexity, etc.), and be configured for any suitable frequencies or frequency ranges. The isolation filter may include any quantity of stages, where each stage may include any quantity of inductive components, capacitive components and/or resistive components. The stages may be connected or appended to each other at any locations and in any desired fashion.

The isolation filter may include any quantity of any conventional or other circuit components (e.g., inductors, capacitors, resistors, etc.) arranged in any desired fashion (e.g., parallel, series, etc.) to filter signals. The capacitive components or capacitors may be implemented by any quantity of any conventional or other capacitive devices (e.g., capacitors or other elements providing capacitance, etc.) including any desired capacitance and arranged in any desired fashion (e.g., series, parallel, etc.). The resistive components or resistors may be implemented by any quantity of any conventional or other resistive devices (e.g., resistors or other elements providing resistance, etc.) including any desired resistance and arranged in any desired fashion (e.g., series, parallel, etc.).

The inductive unit may be of any quantity and be arranged in the isolation filter in any desired fashion (e.g., series, parallel, etc.). The inductive unit may include any desired signal flow path suitable to direct currents induced in the inductive elements in opposing directions and effectively cancel (e.g., U-shape, Z-shape, L-shape, V-shape, parallel, non-parallel etc.). The inductive unit may include any quantity of inductive elements arranged in any desired fashion (e.g., serial, parallel, directly or indirectly coupled, etc.) providing the desired inductance and with a signal flow path canceling the induced extraneous signal currents, where the signal flow path enables at least two inductive elements to provide opposing directions for the induced signal flow to collectively cancel the currents induced in all of the inductive elements. For example, the inductive unit may include two or more inductive elements with the same or different winding direction.

The quantity of inductive elements with each winding direction may be the same or different, where the inductive elements with different winding directions may be arranged in any fashion (e.g., interleaved, groups with the same winding direction, etc.), and the inductances may be selected to induce currents that are directed by the signal flow path to effectively cancel. By way of example only, the inductive unit may include three inductive elements with a first winding direction and one inductive element with the opposing winding direction, where the inductances are selected to enable the current induced in the one inductive element with the opposing winding direction to cancel the currents induced in the remaining inductive elements.

The inductive elements may be implemented by any quantity of any conventional or other inductive devices (e.g., inductors or other elements providing inductance, etc.) including any desired inductance and arranged in any desired fashion (e.g., series, parallel, directly or indirectly coupled, etc.). The inductive elements may be mounted in any fashion or arrangement on any surfaces of any suitable substrate (e.g., PCB, etc.). The inductive element cores may be of any quantity, shape or size, arranged in any desired fashion, and may be constructed of any suitable materials. The inductive element coil or windings may be of any quantity, shape or size, arranged in any desired fashion, may be wound about the core in any desired direction and any quantity of times, and may be constructed of any suitable materials. The direction of the windings of the inductive elements within the inductive unit may be in any direction and be selected in accordance with the signal flow path to effectively cancel the induced currents.

The communications device may be implemented by any conventional or other communications device (e.g., handset, cellular device, etc.). The network access connector may be of any quantity, and may be implemented by any conventional or other connector or access port. The cables may be implemented by any quantity of any conventional or other cables, may be of any shape or size, and may be constructed of any suitable materials. The conductors may be implemented by any quantity of any conventional or other conductors, may be of any shape or size, and may be constructed of any suitable conducting materials. The device and network connectors may be implemented by any quantity of any conventional or other connectors, and may each include any quantity of pins. The pins may be utilized for any desired signals. The connectors (and isolation filter unit) may be disposed external or internal of the communications device and/or network access connector in any desired fashion.

The present invention embodiments may be employed for any suitable communications or other network (digital telephone or other system, LAN, WAN, Internet, Intranet, VPN, etc.). The isolation filter of the present invention embodiments may be utilized for any desired applications (e.g., and within or external of any devices or circuits) to reduce any types of extraneous signals from external conditions exciting coils or other items of circuit components. In addition, the isolation filter unit may include one or more of any of the filters described above (e.g., either individually or in any desired combinations), where each filter may include any quantity of stages.

It is to be understood that the terms "top", "bottom", "front", "rear", "side", "height", "length", "width", "upper", "lower", "vertical" and the like are used herein merely to describe points of reference and do not limit the present invention embodiments to any particular orientation or configuration.

From the foregoing description, it will be appreciated that the invention makes available a novel inductive filter and method of reducing vibration sensitivity, wherein a filter includes one or more inductive units each including at least two inductive elements and a signal flow path providing opposing flow direction to effectively cancel extraneous signal currents induced by vibrations and/or sound pressure (or acoustic) waves, thereby reducing the extraneous signals.

Having described preferred embodiments of a new and improved inductive filter and method of reducing vibration sensitivity, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A filter unit comprising:
    a filter including at least one stage, wherein each stage includes:
        a first capacitive element; and
        a first inductive unit coupled to said first capacitive element and reducing extraneous signals generated by said filter, wherein said first inductive unit includes:
            a plurality of inductive elements connected in series with each including windings disposed about a core and inducing an extraneous signal current to produce an induced extraneous signal current therein in response to at least one of vibration and sound waves; and
            a signal flow path connecting said windings of said plurality of inductive elements and arranged to direct said induced extraneous signal currents from at least two of said inductive elements in opposing directions to collectively cancel said extraneous signal currents induced in said plurality of inductive elements to reduce said extraneous signals generated by said filter.

2. The filter unit of claim 1, wherein said first inductive unit of each said stage is coupled between said first capacitive element and a ground potential, and each said stage further includes:
    a second capacitive element; and
    a second inductive unit coupled between said second capacitive element and said ground potential, wherein said second inductive unit includes a plurality of said inductive elements each inducing a second extraneous signal current to produce a second induced extraneous signal current therein in response to at least one of said vibration and sound waves, and a second signal flow path, wherein at least two of said inductive elements and said second signal flow path direct said second induced extraneous signal current in opposing directions to collectively cancel said second induced extraneous signal currents within said second inductive unit and reduce said extraneous signals generated by said filter.

3. The filter unit of claim 2, wherein each said stage further includes:
    a third capacitive element coupled to said first inductive unit; and
    a fourth capacitive element coupled to said second inductive unit.

4. The filter unit of claim 3, further including:
    a device connector to couple said filter unit to a communications device; and
    a network connector to couple said filter unit to a network access connector accessing a network.

5. The filter unit of claim 4, wherein:
    said filter is coupled between said device connector and said network connector to filter signals traveling from said network to said communications device; and
    said filter unit further includes:
        a second one of said filter coupled between said device connector and said network connector to filter signals traveling from said communications device to said network.

6. The filter unit of claim 5, wherein said filter and said second filter include a corner frequency in the range of 80 kHz-100 kHz.

7. The filter unit of claim 5, wherein each of said capacitive elements includes a capacitance of 27 nanoFarads, and each of said inductive units includes an inductance of 94 microHenrys.

8. The filter unit of claim 1, wherein said extraneous signal includes at least one of noise and audio signals.

9. The filter unit of claim 1, wherein said at least two inductive elements include windings in the same direction.

10. The filter unit of claim 1, wherein said at least two inductive elements include windings in the opposite direction.

11. A filter unit comprising:
    a filter including at least one stage, wherein each stage includes:
        a first capacitive element; and
        a first inductive unit coupled to said first capacitive element and reducing extraneous signals generated by said filter, wherein said first inductive unit includes:
            a plurality of inductive elements each including windings disposed about a core and inducing an extraneous signal current to produce an induced extraneous signal current therein in response to at least one of vibration and sound waves; and
            a signal flow path between said plurality of inductive elements, wherein said signal flow path directs said induced extraneous signal currents of at least two of said inductive elements in opposing directions to collectively cancel said extraneous signal currents induced in said plurality of inductive elements to reduce said extraneous signals generated by said filter;
    wherein said filter unit is disposed between a communications device and a network and receives an input signal including a network signal and an extraneous voiceband signal induced by said communications device.

12. The filter unit of claim 11, wherein said network signal includes a frequency greater than a frequency of said extraneous voiceband signal, and said filter processes said input signal to block said extraneous voiceband signal and pass said network signal.

13. A method of reducing extraneous signals generated by a filter unit including a filter with at least one stage, wherein each stage includes a first capacitive element and a first inductive unit coupled to said first capacitive element and including a plurality of inductive elements connected in series with each including windings disposed about a core and inducing an extraneous signal current to produce an induced extraneous signal current therein in response to at least one of vibration and sound waves, and a signal flow path connecting said windings of said plurality of inductive elements, said method comprising:
    (a) arranging at least two of said inductive elements connected in series and said signal flow path connecting said windings within said first inductive unit to direct said induced extraneous signal currents from said at least two inductive elements in opposing directions to collectively cancel said extraneous signal currents induced in said plurality of inductive elements to reduce said extraneous signals generated by said filter.

14. The method of claim 13, wherein said first inductive unit of each said stage is coupled between said first capacitive element and a ground potential, and each said stage further includes a second capacitive element, and a second inductive unit coupled between said second capacitive element and said ground potential, wherein said second inductive unit includes a plurality of said inductive elements each inducing a second extraneous signal current to produce a second induced extraneous signal current therein in response to at least one of said vibration and sound waves, and a second signal flow path, and said method further includes:
  (b) arranging at least two of said inductive elements and said second signal flow path within said second inductive unit to direct said second induced extraneous signal currents in opposing directions to collectively cancel said second induced extraneous signal currents within said second inductive unit and reduce said extraneous signals generated by said filter.

15. The method of claim 14, wherein each said stage further includes a third capacitive element coupled to said first inductive unit, and a fourth capacitive element coupled to said second inductive unit, and step (a) further includes:
  (a.1) disposing a device connector on said filter unit to couple said filter unit to a communications device; and
  (a.2) disposing a network connector on said filter unit to couple said filter unit to a network access connector accessing a network.

16. The method of claim 15, wherein said filter unit further includes a second one of said filter, and said filter and said second filter are coupled between said device connector and said network connector, and said method further includes:
  (c) filtering signals traveling from said network to said communications device via said filter; and
  (d) filtering signals traveling from said communications device to said network via said second filter.

17. The method of claim 16, wherein said filter and said second filter include a corner frequency in the range of 80 kHz-100 kHz.

18. The method of claim 16, wherein each of said capacitive elements includes a capacitance of 27 nanoFarads, and each of said inductive units includes an inductance of 94 microHenrys.

19. The method of claim 13, wherein said extraneous signal includes at least one of noise and audio signals.

20. The method of claim 13, wherein said at least two inductive elements include windings in the same direction.

21. The method of claim 13, wherein said at least two inductive elements include windings in the opposite direction.

22. A method of reducing extraneous signals generated by a filter unit including a filter with at least one stage, wherein each stage includes a first capacitive element and a first inductive unit coupled to said first capacitive element and including a plurality of inductive elements each including windings disposed about a core and inducing an extraneous signal current to produce an induced extraneous signal current therein in response to at least one of vibration and sound waves, and a signal flow path between said plurality of inductive elements, said method comprising:
  (a) arranging at least two of said inductive elements and said signal flow path within said first inductive unit to direct said induced extraneous signal currents of said at least two inductive elements in opposing directions to collectively cancel said extraneous signal currents induced in said plurality of inductive elements to reduce said extraneous signals generated by said filter, wherein said filter unit is disposed between a communications device and a network; and said method further includes:
  (b) receiving an input signal at said filter including an extraneous voiceband signal induced by said communications device and a network signal including a frequency greater than a frequency of said extraneous voiceband signal, and processing said input signal to block said extraneous voiceband signal and pass said network signal.

* * * * *